United States Patent
Weng et al.

(10) Patent No.: US 9,130,077 B2
(45) Date of Patent: Sep. 8, 2015

(54) STRUCTURE OF DIELECTRIC GRID WITH A METAL PILLAR FOR SEMICONDUCTOR DEVICE

(71) Applicant: Taiwan Semiconductor Manufacturing Company, Ltd., Hsin-Chu (TW)

(72) Inventors: Ssu-Chiang Weng, New Taipei (TW); Kuo-Cheng Lee, Tainan (TW); Chi-Cherng Jeng, Madou Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/968,260

(22) Filed: Aug. 15, 2013

(65) Prior Publication Data

US 2015/0048467 A1    Feb. 19, 2015

(51) Int. Cl.
*H01L 31/0232* (2014.01)
*H01L 31/18* (2006.01)

(52) U.S. Cl.
CPC ............ *H01L 31/0232* (2013.01); *H01L 31/18* (2013.01)

(58) Field of Classification Search
CPC ............ H01L 27/1464; H01L 27/1463; H01L 27/146; H01L 27/14601; H01L 27/14643; H01L 31/0232; H01L 31/18

USPC .................... 257/446, 447, E27.133, E31.11, 257/E31.113

See application file for complete search history.

(56) References Cited

U.S. PATENT DOCUMENTS

| | | | | |
|---|---|---|---|---|
| 6,458,691 B1* | 10/2002 | Subramanian et al. | ........ | 438/638 |
| 2007/0194401 A1* | 8/2007 | Nagai et al. | .................... | 257/447 |
| 2009/0194835 A1* | 8/2009 | Park | .............................. | 257/459 |
| 2009/0243014 A1* | 10/2009 | Lim | .............................. | 257/432 |
| 2014/0339615 A1* | 11/2014 | Wang et al. | .................... | 257/294 |

* cited by examiner

*Primary Examiner* — Tucker Wright
(74) *Attorney, Agent, or Firm* — Haynes and Boone, LLP

(57) ABSTRACT

An image sensor device and a method for manufacturing the image sensor device are provided. An image sensor device includes a substrate, sensor elements disposed at a front surface of the substrate, and a dielectric grid disposed over a back surface of the substrate. The dielectric grid includes a first dielectric layer as a bottom portion, a metal pillar, as a core portion of a upper portion, disposed over the first dielectric layer and a second dielectric layer wrapping around the metal pillar. The image sensor device also includes a stack of layers disposed over the back surface of the substrate. Refractive index of each layers increases from top layer to bottom layer. The image sensor device also includes a color filter and a microlens disposed over the back surface of the substrate.

20 Claims, 7 Drawing Sheets

STRUCTURE OF DIELECTRIC GRID WITH A METAL PILLAR FOR SEMICONDUCTOR DEVICE

BACKGROUND

Integrated circuit (IC) technologies are constantly being improved. Such improvements frequently involve scaling down device geometries to achieve lower fabrication costs, higher device integration density, higher speeds, and better performance. Along with the advantages realized from reducing geometry size, improvements are being made directly to the IC devices. One such IC device is an image sensor device. An image sensor device includes a pixel array for detecting light and recording intensity (brightness) of the detected light. The pixel array responds to the light by accumulating a charge—the more light, the higher the charge. The charge can then be used (for example, by other circuitry) to provide a color and brightness that can be used for a suitable application, such as a digital camera. Common types of pixel grids include a charge-coupled device (CCD) image sensor or complimentary metal-oxide-semiconductor (CMOS) image sensor device.

One type of image sensor device is a backside illuminated image sensor (BSI) device. BSI devices are used for sensing a volume of light projected towards a backside surface of a substrate (which supports the image sensor circuitry of the BSI device). The pixel array is located at a front side of the substrate and the substrate is thin enough so that light projected towards the backside of the substrate can reach the pixel array. BSI devices provide a high fill factor and reduced destructive interference, as compared to front-side illuminated (FSI) image sensor devices. However, due to device scaling, improvements to BSI technology are continually being made to further improve BSI device quantum efficiency. Accordingly, although existing BSI devices and methods of fabricating these BSI devices have been generally adequate for their intended purposes, as device scaling down continues, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
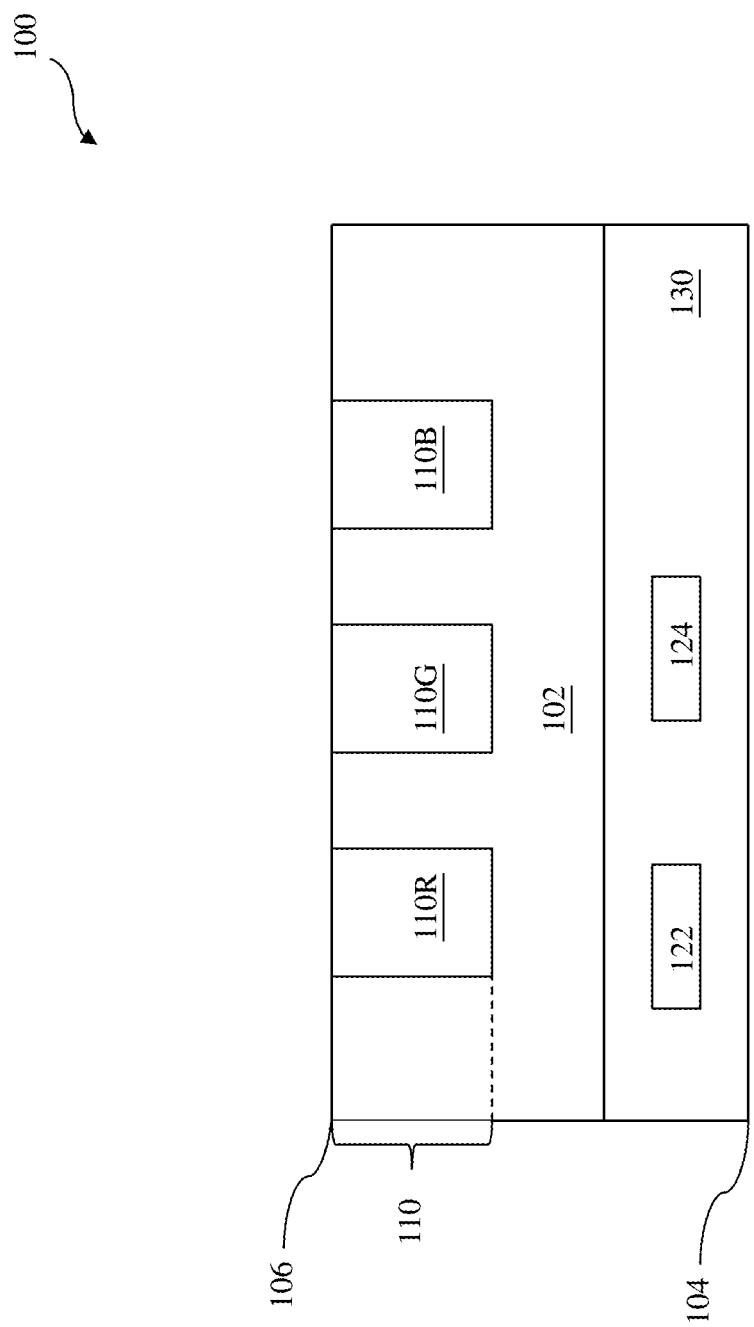
FIG. 1 is a diagrammatic sectional side view of an integrated circuit device precursor according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "over" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

FIG. 1 is a diagrammatic sectional side view, in portion, of an integrated circuit (IC) device precursor according to various aspects of the present disclosure. An example IC device precursor 100 may be an IC chip, system on chip (SoC), or portion thereof, that includes various passive and active microelectronic components, such as resistors, capacitors, inductors, diodes, metal-oxide-semiconductor field effect transistors (MOSFET), complementary MOS (CMOS) transistors, bipolar junction transistors (BJT), laterally diffused MOS (LDMOS) transistors, high power MOS transistors, fin-like field effect transistors (FinFET), other suitable components, or combinations thereof.

The IC device precursor 100 may include a first semiconductor wafer stacked on top of a second semiconductor wafer. For example, the first semiconductor wafer is an image sensor, such as a backside illuminated image sensor (BSI), a complementary metal-oxide-semiconductor (CMOS) image sensor (CIS), a charge-coupled device (CCD), an active-pixel sensor (APS), or a passive-pixel sensor. An image sensor may be fabricated by complementary metal-oxide semiconductor (CMOS) process techniques known in the art. For example, a p-type photo active region and an n-type photo active region are formed over a substrate of the image sensor wafer to form a PN junction, which functions as a photodiode. The image sensor may include a transistor to generate a signal related to the intensity or brightness of light that impinges on the photo active region. The second semiconductor wafer may be an application-specific integrated circuit (ASIC) wafer, or a carrier wafer.

The first and second semiconductor wafers may be bonded together through suitable bonding techniques such as direct bonding. In accordance with some embodiments, in a direct bonding process, the connection between the first and second semiconductor wafers can be implemented through metal-to-metal bonding (e.g., copper-to-copper bonding), dielectric-to-dielectric bonding (e.g., oxide-to-oxide bonding), metal-to-dielectric bonding (e.g., copper-to-oxide bonding), or any combination thereof. In some embodiments, the first and second semiconductor wafers are connected to each other through suitable three-dimensional structure. An adhesion layer may also be used. Additionally, a thinning process may be performed to thin either or both semiconductor wafers from the back surface. The thinning process may include a mechanical grinding process and/or a chemical thinning process.

The IC device precursor 100 includes a substrate 102 having a front surface 104 and a back surface 106 (an upside-down position is shown in FIG. 1). In some embodiments, the substrate 102 includes an elementary semiconductor such as silicon or germanium and/or a compound semiconductor, such as silicon germanium, silicon carbide, gallium arsenic, indium arsenide, gallium nitride, and indium phosphide. Other exemplary substrate materials include alloy semiconductors, such as silicon germanium carbide, gallium arsenic phosphide, and gallium indium phosphide. The substrate 102 may also comprise non-semiconductor materials including soda-lime glass, fused silica, fused quartz, calcium fluoride ($CaF_2$), and/or other suitable materials. In some embodiments, the substrate 102 has one or more layers defined within it, such as an epitaxial layer. For example, the substrate 102 may include an epitaxial layer overlying a bulk semiconductor. Other layered substrates include semiconductor-on-insulator (SOI) substrates. In one such SOI substrate, the substrate 102 includes a buried oxide (BOX) layer formed by a process such as separation by implanted oxygen (SIMOX). In various embodiments, the substrate 102 may take the form of a planar substrate, a fin, a nanowire, and/or other forms known to one of skill in the art.

The substrate 102 may include one or more doped regions (not illustrated). In FIG. 1, the substrate 102 is doped with a p-type dopant. Suitable p-type dopants include boron, gallium, indium, other suitable p-type dopants, and/or combinations thereof. The substrate 102 may also include one or more regions doped with an n-type dopant such as phosphorus, arsenic, other suitable n-type dopants, and/or combinations thereof. Doping may be implemented using a process such as ion implantation or diffusion in various steps and techniques.

The substrate 102 may include isolation features (not illustrated), such as local oxidation of silicon (LOCOS) and/or shallow trench isolation (STI), to separate (or isolate) various regions and/or devices formed on or within the substrate 102. The isolation features include silicon oxide, silicon nitride, silicon oxynitride, other suitable materials, or combinations thereof. The isolation features are formed by any suitable process. For example, forming an STI includes a photolithography process, etching a trench in the substrate (for example, by using a dry etching and/or wet etching), and filling the trench (for example, by using a chemical vapor deposition process) with dielectric material. The filled trench may have a multi-layer structure, such as a thermal oxide liner layer filled with silicon nitride or silicon oxide.

As noted above, the IC device precursor 100 includes sensor elements 110 (also referred to as pixels). The sensor elements 110 detect intensity (brightness) of radiation 112 directed toward the back surface 106 of the substrate 102. In FIG. 1, the sensor elements 110 are configured to correspond with a specific light wavelength, such as a red (R), a green (G), or a blue (B) light wavelength. In other words, the sensor elements 110 are configured to detect intensity (brightness) of a particular light wavelength. In some embodiments, the sensor elements 110 are pixels in a pixel array.

In FIG. 1, the sensor elements 110 include a photodetector, such as a photodiode, that includes a light sensing region (or photo-sensing region) 110R, 110G, and 110B, respectively, which detect intensity (brightness) of red, green, and blue light wavelengths, respectively. The light sensing regions (or photo-sensing regions) 110R, 110G, and 110B may include doped regions having n-type and/or p-type dopants formed in the substrate 102. In some embodiments, the light sensing regions 110R, 110G, and 110B are n-type doped regions, formed by a method such as diffusion and/or ion implantation. The sensor elements 110 further include various transistors, such as a transfer transistor (not illustrated), a reset transistor (not illustrated), a source-follower transistor (not illustrated), a select transistor (not illustrated), other suitable transistors, or combinations thereof. The light sensing regions 110R, 110G, and 110B and various transistors (which can collectively be referred to as pixel circuitry) allow the sensor elements 110 to detect intensity of the particular light wavelength. Additional circuitry, input, and/or outputs may be provided to the sensor elements 110 to provide an operation environment for the sensor elements 110 and/or support communication with the sensor elements 110.

The IC device precursor 100 further includes multilayer interconnect (MLI) features disposed over the front surface 104 of the substrate 102, including over the sensor elements 110. The MLI features are coupled to various components of the image sensor, such as the sensor elements 110, such that the various components of the image sensor are operable to properly respond to illuminated light (imaging radiation). The MLI features may include various conductive features, which may be vertical interconnects, such as contacts and/or vias 122, and/or horizontal interconnects, such as lines 124. The various conductive features 122 and 124 may include conductive materials, such as metals. In an example, metals include aluminum, aluminum/silicon/copper alloy, titanium, titanium nitride, tungsten, polysilicon, metal silicide, or combinations thereof.

Conductive features 122 and 124 may be formed by a process including physical vapor deposition (PVD), chemical vapor deposition (CVD), or combinations thereof. Other manufacturing techniques to form the various conductive features 122 and 124 may include photolithography processing and etching to pattern conductive materials to form the vertical and horizontal interconnects. Still other manufacturing processes may be implemented to form the conductive features, such as a thermal annealing to form metal silicide. The metal silicide used in the multilayer interconnects may include nickel silicide, cobalt silicide, tungsten silicide, tantalum silicide, titanium silicide, platinum silicide, erbium silicide, palladium silicide, or combinations thereof.

It is understood that the MLI features are not limited by the number, material, size, and/or dimension of the conductive features 122 and 124 depicted, and thus, the MLI features may include any number, material, size, and/or dimension of conductive features depending on design requirements of the integrated circuit device precursor 100.

The various conductive features 122 and 124 of the MLI features are disposed in an interlayer (or inter-level) dielectric (ILD) layer 130. The ILD layer 130 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, amorphous fluorinated carbon, Parylene, polyimide, other suitable material, and/or combinations thereof. Common methods for forming ILD layer 130 include thermal oxidation, chemical vapor deposition (CVD), high-density plasma CVD (HDP-CVD), physical vapor deposition (PVD), atomic layer deposition (ALD), spin-on deposition, and/or other suitable deposition processes. The ILD layer 130 may include multiple layers made by different dielectric materials.

Figure 2:
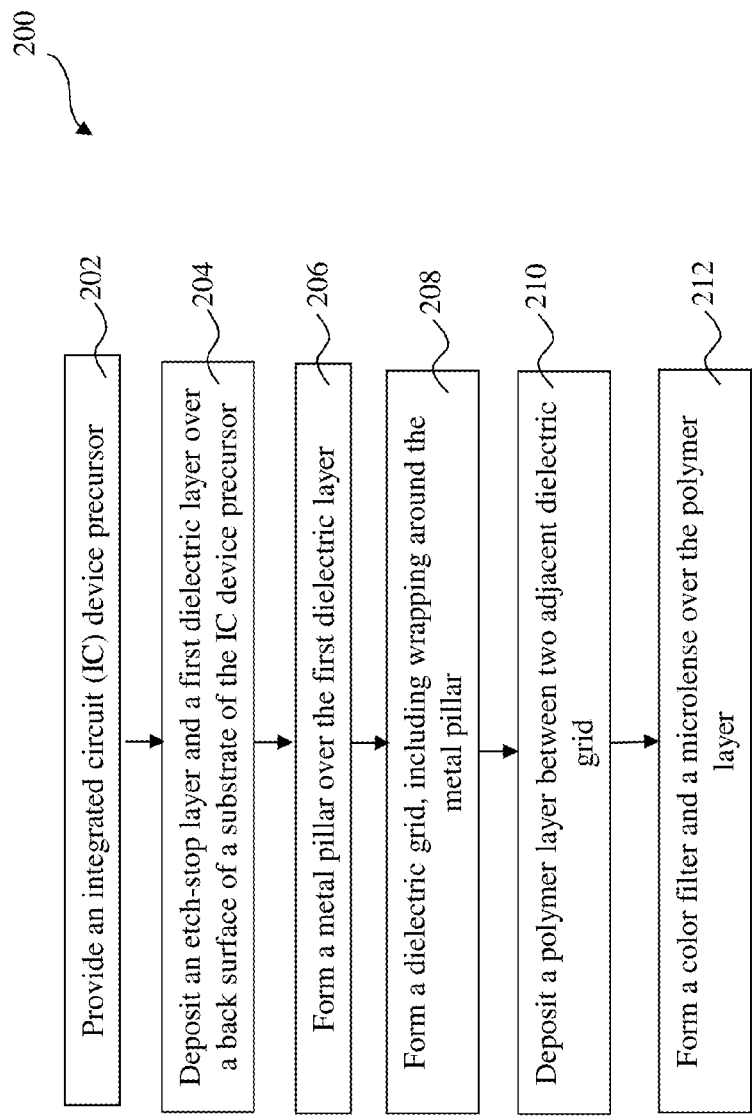
FIG. 2 is a flow chart of a method for fabricating a dielectric grid for an integrated circuit device according to various aspects of the present disclosure.

FIG. 2 is a flowchart of a method 200 of forming a dielectric grid for an integrated circuit device according to various aspects of the present disclosure. FIGS. 3-7 are cross-sectional views of an example IC device 300 undergoing processes according to the method of FIG. 2. It is understood that additional steps can be provided before, during, and after the method, and some of the steps described can be replaced or eliminated for other embodiments of the method.

Figure 3:
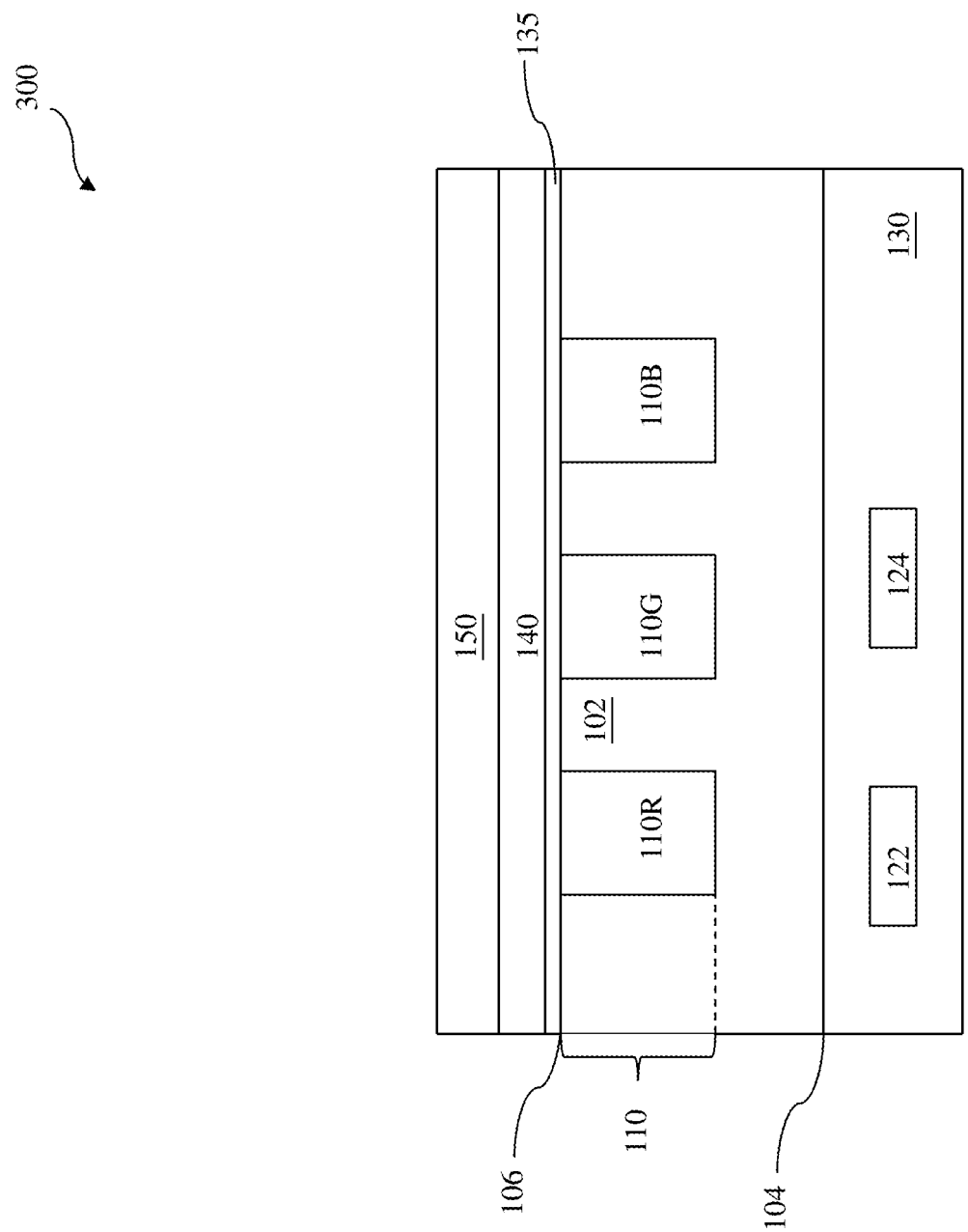
FIGS. 3-7 are diagrammatic sectional side views of an integrated circuit device at various fabrication stages according to the method of FIG. 2.

Referring to FIGS. 2 and 3, the method 200 begins at step 202 by providing the IC device precursor 100 and then proceeds to step 204 by depositing an etching-stop-layer (ESL) 140 over the back surface 106 of the substrate 102 and a first dielectric layer 150 over the ESL 140. The ESL 140 may include silicon nitride, silicon oxynitride and/or silicon carbide. In some embodiments, prior to depositing the ESL 140, a bottom anti-reflection coating (BARC) layer 135 is formed over a back surface 106 of the substrate 102. The BARC layer 135 may include a nitride material, an organic material; an oxide material and/or the like. The first dielectric layer 150 may include silicon oxide. One or more of the layers 135, 140 and 150 may be formed by various methods, including CVD process such as atmospheric pressure CVD (APCVD), low pressure CVD (LPCVD), plasma enhanced CVD (PECVD), or high density plasma CVD (HDP CVD), spin-on coating, and/or other methods known in the art.

Figure 4:
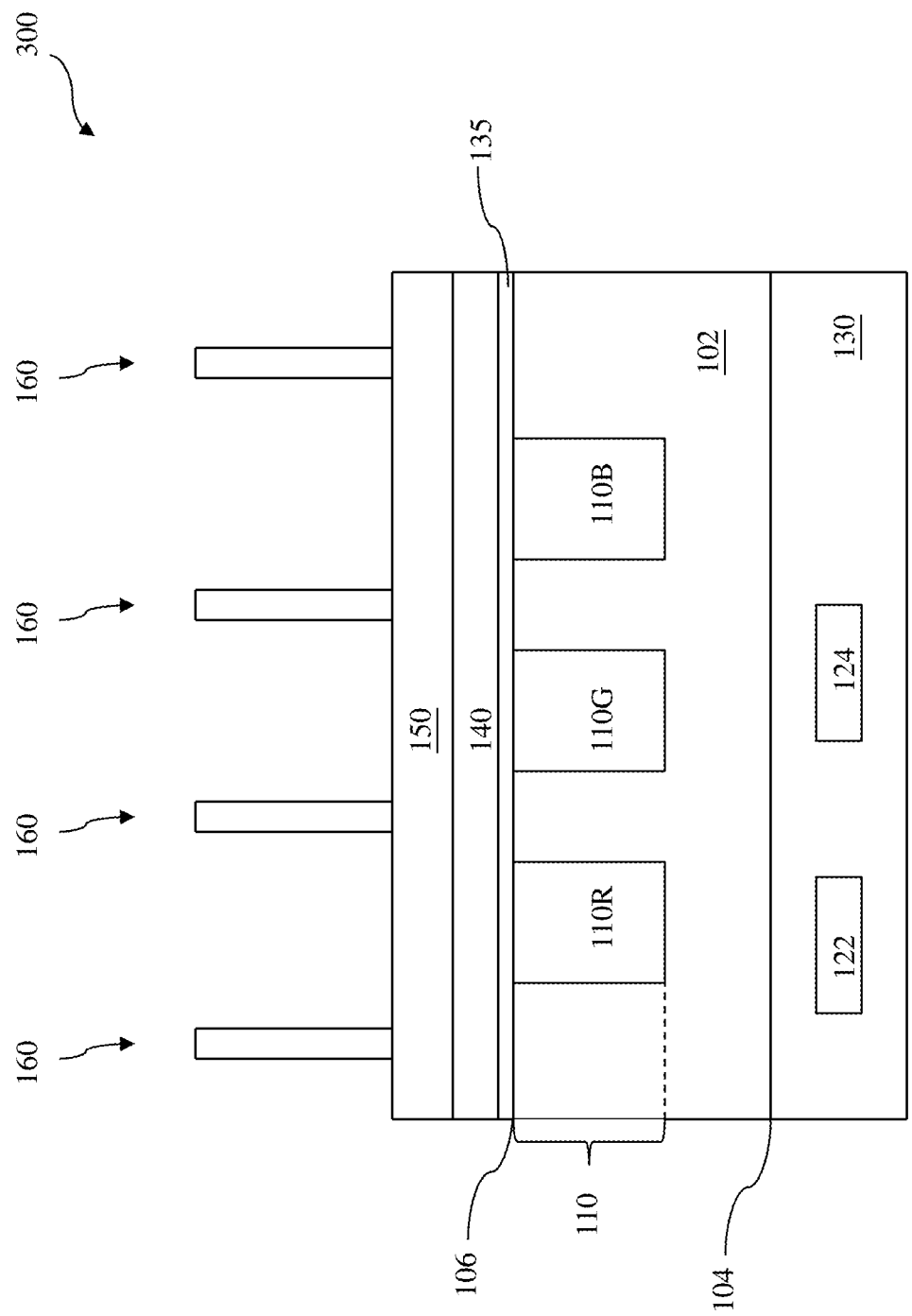

Referring to FIGS. 2 and 4, the method 200 proceeds to step 206 by forming metal pillars 160 over the first dielectric layer 150. The metal pillar 160 may be formed by processes of deposition, lithography and etch. As an example, a metal layer is deposited over the first dielectric layer 150 by PVD. The metal layer may include tungsten (W), aluminum (Al), copper (Cu), or any suitable metals. Then a patterned photoresist layer is formed over the metal layer by processes of spin-on coating, exposure and developing. An etching process is performed to etch the metal layer through the patterned photoresist to form the metal pillar 160. Alternatively, prior to coating photoresist, a first hard mask layer may be formed over the metal layer. Then the first hard mask layer is etched through the patterned photoresist layer first and the metal layer is etched through the etched first hard mask layer to form the metal pillar 160. In some embodiments, the metal pillar 160 is aligned to space between each sensing region 110.

Figure 5:
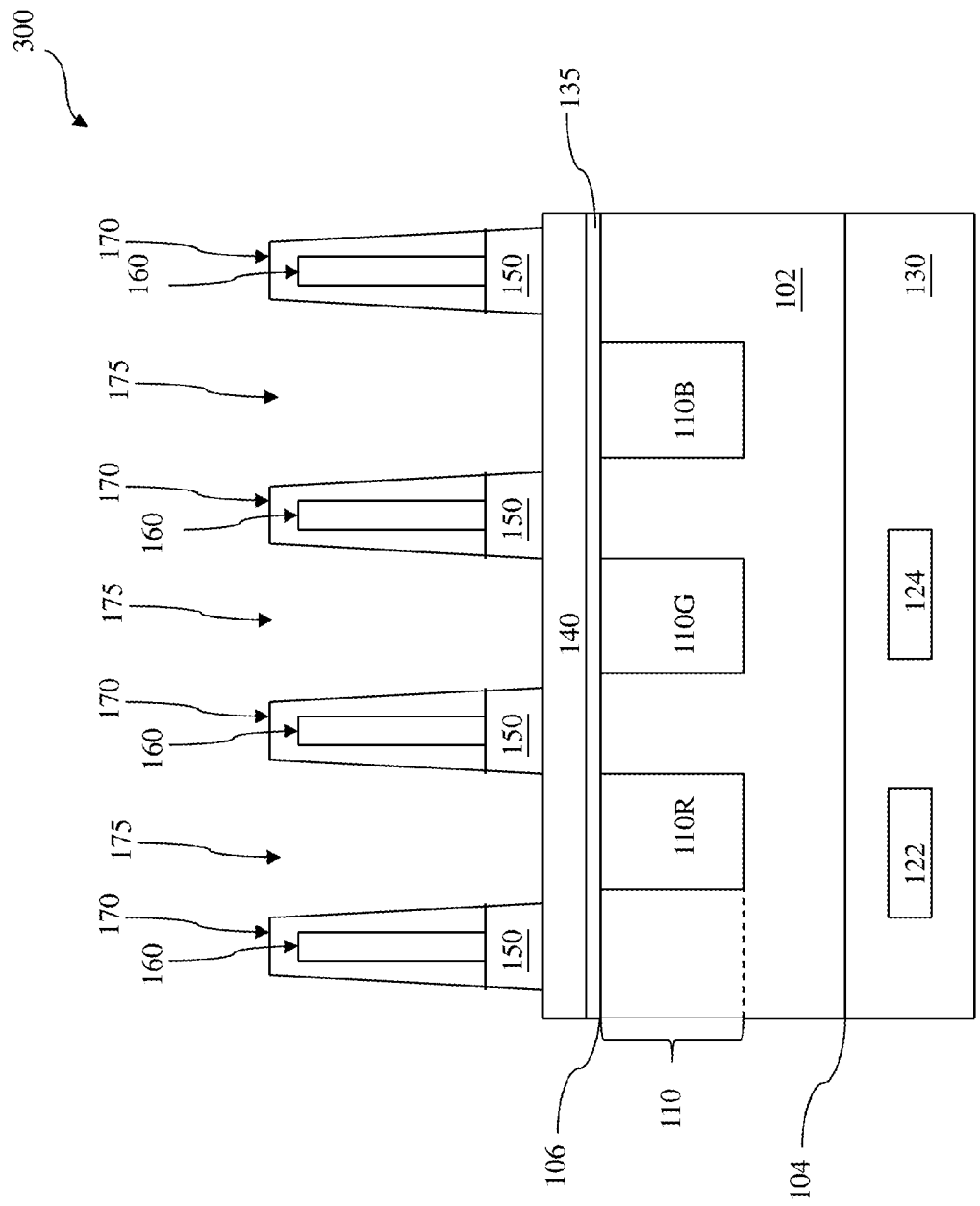

Referring to FIGS. 2 and 5, the method 200 proceeds to step 208 by forming dielectric grid 170 over the ESL 140. The dielectric grid 170 is formed such that it has the first dielectric layer 150 as its bottom portion, the metal pillar 160 as a core portion of its upper portion, which is wrapped by a second dielectric layer. The second dielectric layer includes any suitable dielectric materials, such as silicon oxide. In some embodiments, the second dielectric layer uses same material as the first dielectric layer 150. The dielectric grid 170 may be formed by processes of deposition, lithography and etch. As an example, a silicon oxide layer is deposited over the first dielectric layer 150 and the metal pillar 160 by CVD. Then a patterned photoresist layer is formed over the silicon oxide by processes of spin-on coating, exposure and developing. An etching process is performed to etch the silicon oxide layer through the patterned photoresist to form the dielectric grid 170, with the metal pillar 160 as the core portion of its upper portion. Alternatively, prior to coating photoresist, a hard mask layer may be formed over the silicon oxide layer. Then the hard mask layer is etched through the patterned photoresist layer first and the oxide layer is etched through the etched hard mask layer to form the dielectric grid 170. In some embodiments, the etch process continues to etch the first dielectric layer 150 and use the ESL 140 as an etch stop layer. An open spacing between two adjacent dielectric grids 170 is referred to as a grid trench 175.

Figure 6:
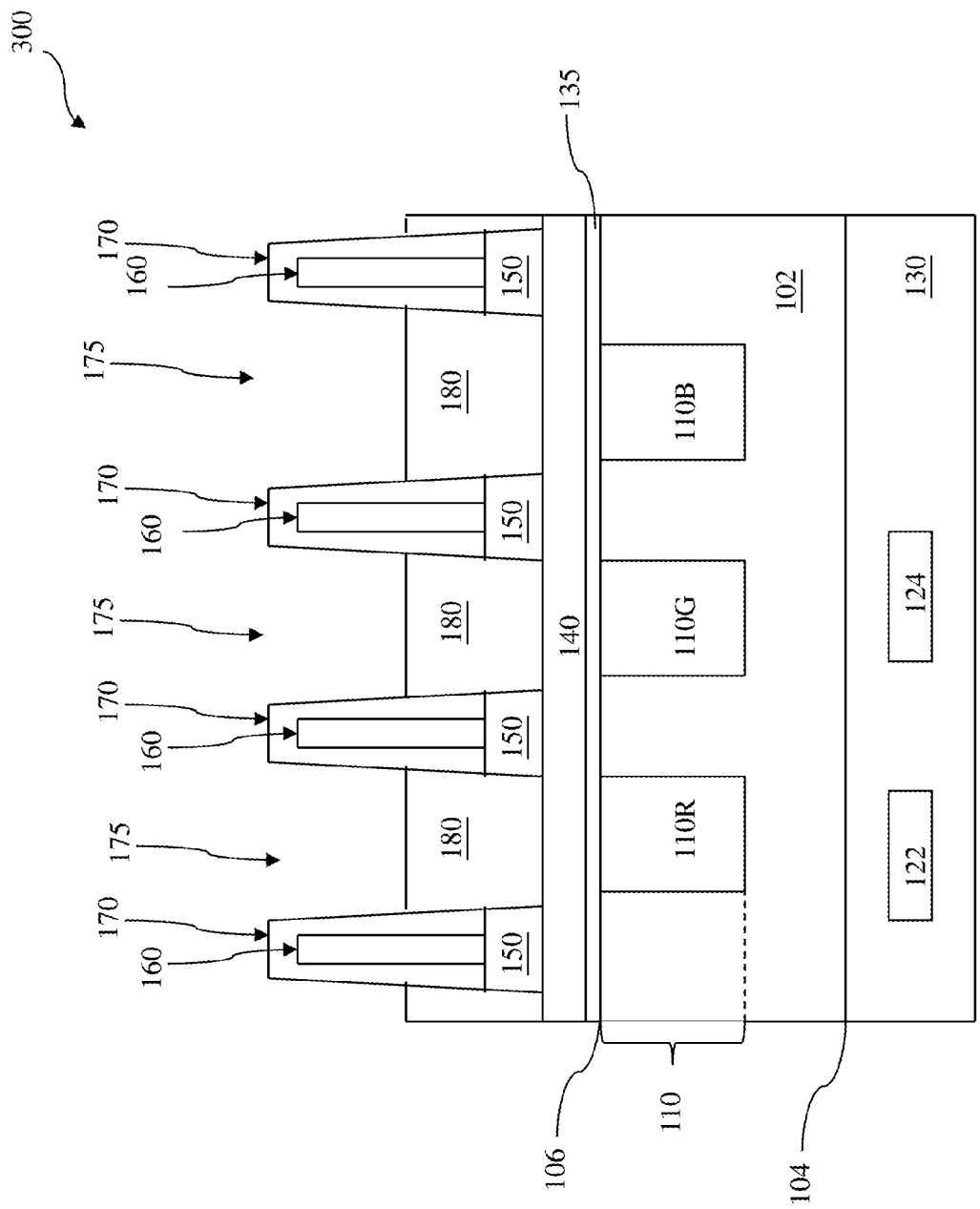

Referring to FIGS. 2 and 6, the method 200 proceeds to step 210 by filling in the grid trench 175 with a polymer layer 180 by a suitable process, such as spin-on or CVD. In some embodiments, the grid trench 175 is partially filled in by the polymer layer 180. In some embodiment, the grid trench 175 is fully filled in by the polymer layer 180.

Figure 7:
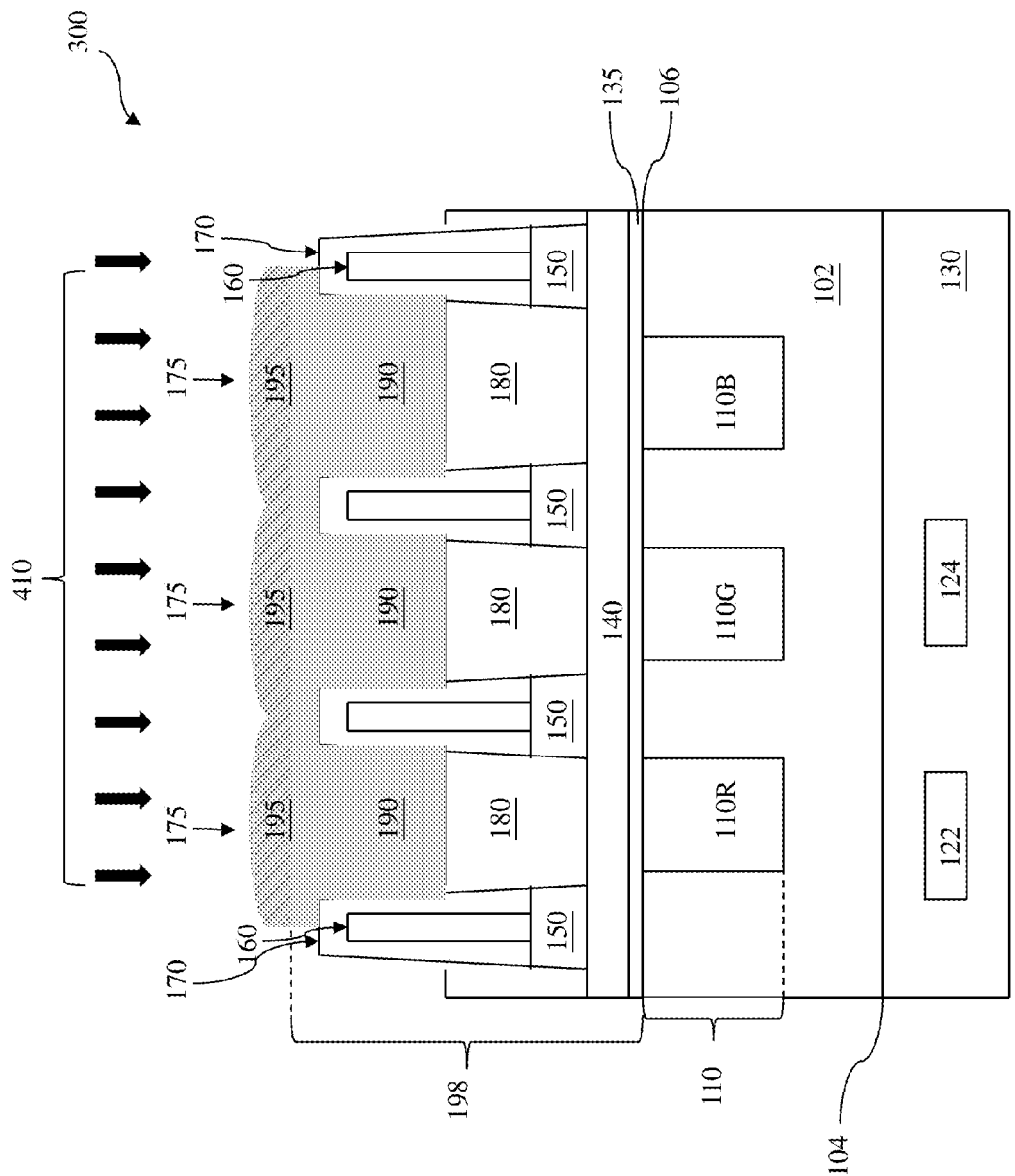

Referring to FIGS. 2 and 7, the method 200 proceeds to step 212 by forming color filters 190 and microlenses 195 over the back surface 106 of the substrate 102. In some embodiments, each of the color filters 190 aligns with the respective light sensing regions 110R, 110G, and 110B. In some embodiments, the grid trench 175 is partially filled in by the polymer layer 180 and thus the color filters 190 are disposed over the polymer layer 180, filled up the grid trench 175 and disposed over the dielectric grid 170. In some embodiment, the grid trench 175 is fully filled in by the polymer layer 180 and thus the color filters 190 are disposed over the polymer layer 180 and the dielectric grid 170.

The color filters 190 are designed so that each filters through light of a predetermined wavelength. For example, the color filter 190 aligned with the light sensing region 110R may be configured to filter through visible light of a red wavelength to the light sensing region 110R, the color filter 190 aligned with the light sensing region 110G may be configured to filter through visible light of a green wavelength to the light sensing region 110G, or the color filter 190 aligned with the light sensing region 110B may be configured to filter through visible light of a blue wavelength to the light sensing region 110B. The color filters 190 include any suitable material. In an example, the color filters 190 include a dye-based (or pigment-based) polymer for filtering out a specific frequency band (for example, a desired wavelength of light). Alternatively, the color filters 190 could include a resin or other organic-based material having color pigments.

The microlenses 195, disposed over the back surface 106 of the substrate 102, align with respective light sensing regions 110A, 110G, and 110B of the sensor elements 110. In some embodiments, the lenses 195 are disposed over the color filters 190. The microlenses 195 may be in various positional arrangements with the sensor elements 110 and color filters 190, such that the microlens 195 focuses an incoming incident radiation on the respective light sensing regions 110R, 110G, and 110B of the sensor elements 110. The microlenses 195 include a suitable material, and may have a variety of shapes and sizes depending on an index of refraction of the material used for the microlens and/or a distance between the microlens and sensor elements 110. Alternatively, the position of the color filters 190 and microlens layer 195 may be reversed, such that the microlenses 195 are disposed between the back surface 106 of the substrate 102 and color filters 190. The present disclosure also contemplates the integrated circuit device 300 having a color filter layer disposed between microlens.

For the sake of description, all layers above the back surface 106 of the substrate 102, including between and above each dielectric grids 170, are referred to as a stack 198. Refractive indexes of the color filter 190, the polymer layer 180, the ESL 150 and ARC layer 135 are $n_1$, $n_2$, $n_3$ and $n_4$, respectively. In some embodiments, materials of the color filter 190, the polymer layer 180, the ESL 140 and the ARC layer 135 are chosen such that $n_1$ is smaller than $n_2$, $n_2$ is smaller than $n_3$, and $n_3$ is smaller than $n_4$. For example, $n_1$ of the color filter 190 is 1.6, $n_2$ of the polymer layer 180 is larger than 1.6 and less than 2, $n_3$ of the ESL 140 is 2 and $n_4$ of the ARC layer 135 is larger than 2.

Additional layer can be formed before, between, or over layers mentioned above in the stack 198 and some of the layers described can be replaced, eliminated, or moved around for additional embodiments of the method 100. In some embodiments, the stack 198 is configured so that the refractive index of each layers increases from top to bottom in the stack 198. For example, a P+ epitaxial layer is disposed between the back surface 106 of the substrate 102 and the ARC layer 135.

Referring also to FIG. 7, in operation, the integrated circuit device 300 is designed to receive a radiation 410 traveling towards the back surface 106 of the substrate 102. In the depicted embodiment, the incident radiation 410 is visual light. Alternatively, the radiation 410 could be infrared (IR), ultraviolet (UV), X-ray, microwave, other suitable radiation type, or combinations thereof. The microlenses 195 direct the incident radiation 410 to the respective color filters 190. The light then passes through the color filters 190 to a corresponding sensor element 110, specifically to respective light sensing regions 110R, 110G, and 110B. Light passing through to the color filters 190 and sensor elements 110 may be maximized since the light is not obstructed by various device features (for example, gate electrodes) and/or metal features (for example, the conductive features 122 and 134 of the MLI features) overlying the front surface 104 of the substrate 102. The desired wavelengths of light (for example, red, green, and blue light) are more efficiently allowed to pass through to the respective light sensing regions 110R, 110G, and 110B of the sensor elements 110. When exposed to the light, the light sensing regions 110R, 110G, and 110B of the sensor elements 110 produce and accumulate (collect) electrons, which may be converted to voltage signals.

Based on the above, the present disclosure offers an integrated circuit device employing a structure of a dielectric grid with a metal pillar in its core, a stack of layers with increasing refractive index from top layer to bottom layer and fabrication. The metal pillar within the dielectric grid reduces/prevents light from traveling through and reduces cross talk among the various light sensing regions, such as 110R, 110G and 110B by reflecting the transmittance light. The stack with low to high refractive index structure enhances transmittance rate and improves quantum efficiency. The device also employs an ESL for a better control of the dielectric grid profile and provides an intermediate layer in the stack as well. The device also employs the high refractive index polymer layer to increase critical angle of total internal reflection, which will reduce crosstalk.

The present disclosure provides for many different embodiments. For example, an image sensor device includes a substrate having a front surface and a back surface, a plurality of sensor elements disposed at the front surface of the substrate. Each of the plurality of sensor elements is operable to sense radiation projected towards the back surface of the substrate. The image sensor device also includes a dielectric grid disposed over the back surface of the substrate. The dielectric grid includes a first dielectric layer as a bottom portion, a metal pillar as a core portion of an upper portion, disposed over the first dielectric layer and a second dielectric layer wrapping around the metal pillar. The image sensor device also includes a stack of layers disposed over the back surface of the substrate, including between and above dielectric grids. Refractive indexes increase from top layer to bottom layer.

In another embodiment, a device includes a substrate having a front surface and a back surface, a plurality of sensor elements disposed at the front surface of the substrate. The plurality of sensor elements is operable to sense radiation projected towards the back surface of the substrate. The device also includes a dielectric grid disposed over the back surface of the substrate. The dielectric grid includes a first dielectric layer as its bottom portion, a metal pillar as its core portion of an upper portion and a second dielectric layer wrapping around the metal pillar. The device also includes a stack of layers disposed over the back surface of the substrate, including between dielectric grids. Refractive indexes increase from top layer to bottom layer. The device also includes a plurality of color filters and microlenses disposed over the stack of layers and aligned with respective sensor elements.

In yet another embodiment, a method for fabricating a device includes providing a substrate having a front surface and a back surface, a plurality of sensor elements are disposed at the front surface of the substrate. Each of the plurality of sensor elements is operable to sense radiation projected towards the back surface of the substrate. The method also includes depositing an etch-stop-layer (ESL) over the back surface of the substrate, depositing a first dielectric layer over the ESL, depositing a metal layer over the first dielectric layer, etching the metal layer through a first patterned mask layer to form a metal pillar, depositing a second dielectric layer over the metal pillar and the first dielectric layer, etching the second and first dielectric layers through a second mask to form a dielectric grid, including wrapping around the metal pillar, by using the ESL as an etch stop layer. The method also includes depositing a polymer layer between adjacent dielectric grids and forming a color filter and a microlens over the polymer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device comprising:
    a substrate having a front surface and a back surface;
    a plurality of sensor elements disposed within the substrate, each of the plurality of sensor elements being operable to sense radiation projected towards the back surface of the substrate;
    a dielectric grid disposed over the back surface of the substrate, the dielectric grid including:
        a first dielectric layer as a bottom portion;
        a metal pillar as a core portion of an upper portion, disposed over the first dielectric layer; and
        a second dielectric layer wrapping around the metal pillar;
    a stack of layers disposed over the back surface of the substrate, wherein at least one of the layers is positioned between dielectric grids; and
    a color filter disposed on the dielectric grid such that a bottom of the color filter is below a top of the metal pillar.

2. The image sensor device of claim 1, wherein the stack of layers comprises (from bottom to top);
    an anti-reflection coating (ARC) layer over the back surface of the substrate;
    an etch-stop-layer (ESL) over the ARC layer; and
    a polymer layer over the ESL.

3. The image sensor device of claim 2, wherein a refractive index of the polymer layer is substantially smaller than a refractive index of the ESL, which is substantially smaller than a refractive index of the ARC layer.

4. The image sensor device of claim 2, wherein the dielectric grid is disposed over the ESI, wherein the polymer layer is disposed between dielectric grids.

5. The image sensor device of claim 1, wherein the color filter aligns with a respective sensor element.

6. The image sensor device of claim 5, wherein a refractive index of the color filter is substantially smaller than a refractive index of the top layer of the stack.

7. The image sensor device of claim 1, further comprising: a microlens disposed over the back surface of the substrate and aligned with the respective sensor element.

8. The image sensor device of claim 2, further comprising: a P+-type epitaxial layer under the ARC layer.

9. The image sensor device of claim 8, wherein a refractive index of the P+-type epitaxial layer is substantially larger than a refractive index of the ARC layer.

10. The image sensor device of claim 1, wherein the metal pillar includes metals from the group consisting of tungsten (W), aluminum (Al) and copper (Cu).

11. A device comprising:
a substrate having a front surface and a back surface;
a plurality of sensor elements disposed within the substrate, the plurality of sensor elements being operable to sense radiation projected towards the back surface of the substrate;
a dielectric grid disposed over the back surface of the substrate, wherein the dielectric grid includes:
a first dielectric layer as its bottom portion;
a metal pillar as its core portion of an upper portion; and
a second dielectric layer wrapping around the metal pillar;
a stack of layers disposed over the back surface of the substrate, including between dielectric grids; and
a plurality of color filters and microlenses disposed over the stack of layers and aligned with respective sensor elements, the color filters being positioned such that bottoms of the color filters are below a top of the metal pillar.

12. The device of claim 11, wherein the stack of layers comprises (from bottom to top):
an anti-reflection coating (ARC) layer over the back surface of the substrate;
an etch-stop-layer (ESL) over the ARC layer; and
a polymer layer over the ESL, including between the dielectric grids.

13. The device of claim 1, wherein the color filter is disposed over the stack of layers and the dielectric grid.

14. The device of claim 13, wherein a refractive index of the color filter is substantially smaller than the refractive index of the top layer of the stack of layers.

15. The device of claim 13, wherein the microlenses are disposed over the color filters.

16. The device of claim 11, wherein the metal pillar includes metals from the group consisting of tungsten (W), aluminum (Al) and copper (Cu).

17. A device comprising:
a substrate having a front surface and a back surface, wherein a plurality of sensor elements are disposed within the substrate, each of the plurality of sensor elements being operable to sense radiation projected towards the back surface of the substrate;
a first dielectric layer over the back surface of the substrate;
a metal pillar over the first dielectric layer; and
a second dielectric layer over the metal pillar and the first dielectric layer, wherein the second and first dielectric layers form a dielectric grid, including wrapping around the metal pillar;
a polymer layer between dielectric grids; and
a color filter over the polymer layer, the color filter positioned such that a bottom of the color filter is lower than a top of the metal pillar.

18. The device of claim 17, wherein the color filter has a refractive index smaller than a refractive index of the polymer layer.

19. The device of claim 18, further comprising:
a lens over the polymer layer.

20. The device of claim 17, further comprising:
a $p^+$-type epitaxial layer over the back surface of the substrate;
an etch stop layer (ESL) over the back surface of the substrate; and
an anti-reflection coating (ARC) layer between the $p^+$-type epitaxial layer and the ESL, wherein the $p^+$-type epitaxial layer is chosen to have a refractive index larger than the ARC layer, wherein the ARC layer is chosen to have a refractive index larger than the ESL.

* * * * *